United States Patent
Freer et al.

(10) Patent No.: US 10,950,774 B2
(45) Date of Patent: Mar. 16, 2021

(54) THERMOELECTRIC MATERIALS AND DEVICES COMPRISING GRAPHENE

(71) Applicant: The University of Manchester, Manchester (GB)

(72) Inventors: Robert Freer, Manchester (GB); Colin Norman, Manchester (GB); Yue Lin, Manchester (GB); Deepanshu Srivastava, Manchester (GB); Ian Kinloch, Manchester (GB)

(73) Assignee: The University of Manchester, Manchester (GB)

( * ) Notice: Subject to any disclaimer, the term of this patent is extended or adjusted under 35 U.S.C. 154(b) by 605 days.

(21) Appl. No.: 14/767,730

(22) PCT Filed: Feb. 14, 2014

(86) PCT No.: PCT/GB2014/050437
§ 371 (c)(1),
(2) Date: Aug. 13, 2015

(87) PCT Pub. No.: WO2014/125292
PCT Pub. Date: Aug. 21, 2014

(65) Prior Publication Data
US 2015/0380625 A1    Dec. 31, 2015

(30) Foreign Application Priority Data

Feb. 14, 2013  (GB) ..................................... 1302556

(51) Int. Cl.
*H01L 35/22* (2006.01)
*H01L 35/26* (2006.01)
(Continued)

(52) U.S. Cl.
CPC .............. *H01L 35/22* (2013.01); *C01B 32/19* (2017.08); *C01B 32/194* (2017.08); *C04B 35/01* (2013.01);
(Continued)

(58) Field of Classification Search
CPC ......... H01L 35/00; H01L 35/22; H01L 35/26; H01L 35/34
See application file for complete search history.

(56) References Cited

U.S. PATENT DOCUMENTS

2008/0248275 A1* 10/2008 Jang ...................... B82Y 30/00
                                                            428/220
2011/0111299 A1*  5/2011 Liu ........................ B82Y 30/00
                                                            429/221
(Continued)

FOREIGN PATENT DOCUMENTS

CN    102112393 A      6/2011
CN    102760829 A  * 10/2012
(Continued)

OTHER PUBLICATIONS

Machine translation of CN102760829 (A), Xinbing et al. (Year: 2012).*
(Continued)

*Primary Examiner* — Mayla Gonzalez Ramos
(74) *Attorney, Agent, or Firm* — Wilmer Cutler Pickering Hale and Dorr LLP (57) ABSTRACT

Composite materials with thermoelectric properties and devices made from such materials are described. The thermoelectric composite material may comprise a metal oxide material and graphene or modified graphene. It has been found that the addition of graphene or modified graphene to thermoelectric metal oxide materials increases ZT. It has further been found that the ZT of the metal oxide becomes
(Continued)

effective over a broader temperature range and at lower temperatures.

19 Claims, 2 Drawing Sheets

(51) Int. Cl.

| | | |
|---|---|---|
| *H01L 35/34* | (2006.01) | |
| *H01L 35/12* | (2006.01) | |
| *C04B 35/01* | (2006.01) | |
| *C04B 35/453* | (2006.01) | |
| *C04B 35/47* | (2006.01) | |
| *C04B 35/645* | (2006.01) | |
| *C25D 9/02* | (2006.01) | |
| *C01B 32/19* | (2017.01) | |
| *C01B 32/194* | (2017.01) | |

(52) U.S. Cl.
CPC .......... *C04B 35/016* (2013.01); *C04B 35/453* (2013.01); *C04B 35/47* (2013.01); *C04B 35/645* (2013.01); *C25D 9/02* (2013.01); *H01L 35/12* (2013.01); *H01L 35/26* (2013.01); *H01L 35/34* (2013.01); *C04B 2235/3208* (2013.01); *C04B 2235/3213* (2013.01); *C04B 2235/3237* (2013.01); *C04B 2235/3267* (2013.01); *C04B 2235/3275* (2013.01); *C04B 2235/3284* (2013.01); *C04B 2235/3298* (2013.01); *C04B 2235/422* (2013.01); *C04B 2235/5292* (2013.01); *C04B 2235/652* (2013.01); *C04B 2235/6581* (2013.01); *C04B 2235/6585* (2013.01); *C04B 2235/663* (2013.01); *C04B 2235/666* (2013.01); *C04B 2235/721* (2013.01); *C04B 2235/80* (2013.01); *Y02P 20/129* (2015.11)

(56) References Cited

U.S. PATENT DOCUMENTS

| | | |
|---|---|---|
| 2011/0155478 A1 | 6/2011 | Choi et al. |
| 2011/0256014 A1 | 10/2011 | Hong et al. |
| 2012/0312344 A1 | 12/2012 | Delorme |
| 2013/0026427 A1* | 1/2013 | Backhaus-Ricoult ....................... C04B 35/47 252/519.12 |
| 2013/0167897 A1 | 7/2013 | Choi et al. |
| 2013/0264572 A1 | 10/2013 | Lee et al. |
| 2014/0225022 A1 | 8/2014 | Backhaus-Ricoult et al. |
| 2014/0345843 A1* | 11/2014 | Kirkor ................... F28F 23/00 165/185 |

FOREIGN PATENT DOCUMENTS

| | | |
|---|---|---|
| CN | 102760830 A | 10/2012 |
| EP | 1791191 A1 | 5/2007 |
| JP | 2002-033527 A | 1/2002 |
| JP | 2004-087714 A | 3/2004 |
| JP | 2006-062951 A | 3/2006 |
| JP | 2010506013 A | 2/2010 |
| JP | 2011-225993 A | 11/2011 |
| JP | 2012-089604 A | 5/2012 |
| JP | 2012-253302 A | 12/2012 |
| KR | 2007-0048734 A | 5/2007 |
| KR | 2011-0039568 A | 4/2011 |
| KR | 2012-0035793 A | 4/2012 |
| WO | WO-2008130431 A2 | 10/2008 |
| WO | WO-2010030361 A1 | 3/2010 |
| WO | WO-2011139236 A1 | 11/2011 |
| WO | WO-2013/012065 A1 | 1/2013 |

OTHER PUBLICATIONS

Koumoto et al., "Thermoelectric Ceramics for Energy Harvesting," Journal of American Ceramic Society, vol. 96, No. 1, pp. 1-23, Jan. 2013.

Li et al., "Electronic structure and thermoelectric properties of $Bi_2Te_3$ crystals and graphene-doped $Bi_2Te_3$," Thin Solid Films, vol. 518, pp. e57-e60, (2010).

Green et al., "Solution Phase Production of Graphene with Controlled Thickness via Density Differentiation," Nano Letters, vol. 9, No. 12, pp. 4031-4036, (2009).

International Search Report and Written Opinion dated Apr. 24, 2014, in the International Application No. PCT/GB2014/050437, filed Feb. 14, 2014, 14 pages.

Fergus, "Oxide materials for high temperature thermoelectric energy conversion," Journal of the European Ceramic Society, Mar. 2012, vol. 23, Issue 3, pp. 525-540.

Feng et al., "Graphene promoted oxygen vacancies in perovskite for enhanced thermoelectric properties," Carbon, (2017), vol. 112, pp. 169-176, available online Nov. 9, 2016.

Snyder et al., "Complex thermoelectric materials," Nature Materials, Feb. 2008, vol. 7, pp. 105-114.

* cited by examiner

THERMOELECTRIC MATERIALS AND DEVICES COMPRISING GRAPHENE

CROSS-REFERENCE TO RELATED APPLICATIONS

This application is a national stage application of International Application No. PCT/GB2014/050437 filed on Feb. 14, 2014 which claims priority to GB Application No. 1302556.4 filed on Feb. 14, 2013, the disclosures of each of which are hereby incorporated by reference in their entirety.

This invention relates to composite materials with thermoelectric properties and devices made from such materials. The present invention is concerned with novel materials for use in thermoelectric generators. These materials can be used in power generation to convert waste heat into electrical power in a wide variety of different applications ranging from automotive applications to space exploration and satellite technology. The same materials can also be used in thermoelectric cooling devices such as refrigerators which transfer heat from one side of the materials to the other on the application of an electric current.

BACKGROUND

The generation of electrical power by the direct conversion of heat to electricity is known as thermoelectric power generation. It is based on a phenomenon called the Seebeck effect, in which an electromotive force develops when materials are placed in a temperature gradient. Thermoelectric power generation is a rapidly growing sector with applications for waste heat recovery in many areas such as automotive, renewable energy, electronics, aerospace, geothermal, heavy manufacturing industries (glass and brick making, refineries, power plants etc) and remote power generation (oil/gas rigs).

Thermoelectric effects can also be used for refrigeration. The corresponding cooling effect generated in passing a current through a thermoelectric material is known as the Peltier effect. This can be used to provide solid state cooling devices in which a heat flux arises between two different materials. Typically an N-type and a P-type semiconductor in electrical contact with one another are able to generate a thermal gradient between two sides of the material. The cool side can therefore be used as a source of cooling.

There are vast numbers of materials known that exhibit thermoelectric behaviour but very few that possess all the properties required for the development of efficient thermoelectric devices.

The thermoelectric community uses ZT the dimensionless figure of merit to characterise the efficiency of thermoelectric materials. The consensus is that a ZT≥1 is desirable for practical applications, current state of the art commercially available materials possess a maximum ZT of approximately unity. ZT is calculated using equation (1):

$$ZT = \left(\frac{\sigma S^2}{\kappa}\right)T \quad (1)$$

where $\sigma$ is the electrical conductivity, S is the Seebeck coefficient, $\kappa$ is the thermal conductivity and T is the absolute temperature. For certain applications, ZTs above about 0.5 or even above about 0.2 are acceptable. Properties such as the ZT value, the power density and the thermal power cannot be empirically determined and are an inherent feature of a particular material in the same way that the thermal conductivity and electrical conductivity are.

To produce electrical energy from a heat source it is desirable to have both an n-type material and a p-type material which exhibit a high ZT.

The existing materials which exhibit sufficient ZT values are usually too heavy, too expensive, and/or too toxic to find general application though they remain of theoretical interest.

Thermoelectric materials have a "thermal window" within which they are able to convert heat energy into electrical energy. This can be thought of as an operating range within which the materials display useful properties. Outside of this temperature range, which is unique to any particular material, the material has little or no ability to generate electrical energy in response to heat. Consequently, the exploitation of these materials in various applications is limited not only by their ZT values but also by the range of temperature within which they operate. Although there is no empirical means for predicting the operating temperature ranges of thermoelectric materials, commonly used thermoelectric materials can nevertheless be classified by reference to their operating temperature range. Generally speaking, known thermoelectric materials can be separated into three optimal temperature ranges:

I. Low temperature materials (up to ~200° C.): for near room temperature applications and for refrigeration are usually based on alloys of bismuth in combinations with antimony, tellurium, tin or selenium. The peak ZT of these materials range from about 0.8-1.1 with the p-type achieving the highest values. These are effective for cooling applications and for low temperature waste heat recovery but they are confined to applications using such low operating temperatures and contain rare toxic elements.

II. Medium temperature materials (up to ~600° C.): Alloys of lead, tin and tellurium. The peak ZT of these materials is optimised between 0.6-0.8. These materials are currently used for thermoelectric power generation in remote places. These materials do not find broad application because they are limited to below 600° C. and are optimised at around 400° C.

III. High temperature materials (up to ~800° C.) Alloys of silicon and germanium. These materials have been used in prototypes of automobile exhaust thermoelectric generators, but these materials, particularly the p-type, suffer from a fairly low ZT due to the high lattice thermal conductivity of the diamond structure.

Many of the most effective thermoelectric materials comprise tellurium, with $Bi_2Te_3$ being commonly used. Tellurium is as rare as gold and has uses in many other industries such as in the steel industry, for the vulcanisation of tyres, and as a component of mobile phones and solar cells. The cost of the raw material is very high and is increasing dramatically. These materials have the advantage of good ZT values but this advantage can be offset due to the fact that the materials tend to be heavy and are also toxic and/or an environmentally unfriendly.

Li et al (Thin Solid Films 518 (2010) e57-e60), discloses the electronic structure and thermoelectric properties of bismuth telluride crystals and bismuth telluride crystals which have also been doped with graphene. In this reference, graphene doped bismuth telluride poly crystalline samples were prepared using a solid-state reaction. Both materials showed good ZT values although the increase in ZT on doping with graphene was relatively small at between 1.0 and 1.5 times. These materials also show a relatively narrowly defined improvement in the ZT value in terms of the temperature range across rich the improvement is achieved.

Clathrates and skutterudites have been around since the 1990s and are known as phonon glasses. These materials have an open cage like structure and the thermal conductivity can be reduced by putting atoms into the cages. Doping the materials interferes with phonon propagation thus reducing the materials thermal conductivity but not affecting the electrical conductivity. There are reports of ZTs as high as 1.4 at 600° C. for these materials; however the preparation of these materials often requires high temperature and pressure. The family of skutterudites include $CoSb_3$ which is being explored as a replacement for Te-based compounds. Whilst cheaper than $Bi_2Te_3$ it is almost as dense (therefore weight penalty) and there are the same problems of high temperature stability and processing can be difficult.

In the last few years magnesium silicide, $Mg_2Si$, has attracted much attention because of encouraging thermoelectric properties and also because of its low density, less than one third of that of $Bi_2Te_3$. $Mg_2Si$ is not particularly toxic. However, producing high quality $Mg_2Si$ consistently continues to be a problem and there are questions about its high temperature stability.

Over the last 10 year researchers have worked on trying to find suitable environmentally friendly alternatives to these alloys and this effort has yielded the development of oxide based material (see Koumoto et al. Thermoelectric Ceramics for Energy Harvesting. *J. Am. Ceram. Soc.*, 1-23, 2012; Fergus, Oxide Materials for high Temperature Thermoelectric Energy conversion, *Journal of the European Ceramic Society*, 32, 525-540, 2012). These oxides possess many advantages over the traditional metal alloys. They are made from non-toxic, naturally abundant, light cheap elements and they are stable at the elevated temperatures present in many heat recovery applications but unfortunately the thermoelectric properties of these oxides continue to be inferior to traditional metal materials. This low efficiency is the reason that oxide based materials have failed to replace traditional alloys and thus limited the wide range of commercial applications that could be possible with these materials.

It is an object of certain embodiments of this invention to provide thermoelectric materials which are of a lower density than prior art materials. Certain embodiments of the invention also aim to provide thermoelectric materials that provide a higher level of power density; in other words, the materials are able to generate relatively more electrical power compared to their mass than conventional thermoelectric materials do.

It is an object of certain embodiments of this invention to provide thermoelectric materials which are cheaper than prior art materials.

It is an object of certain embodiments of this invention to provide thermoelectric materials which are less-toxic than prior art materials.

It is an object of certain embodiments of the invention to provide thermoelectric materials which are effective over a broader temperature range or over a more useful temperature range than prior art materials. In certain embodiments, a material having a lower absolute ZT value than a comparable or different thermoelectric material but which has a broader range of operating temperatures may be considered to be desirable. Such materials will have a wider range of technical applications and will also be able to provide a more reliable source of electrical power despite fluctuations in the thermal environment. In certain other embodiments of the invention it is also desirable to provide substantially uniform level of electrical energy across the operating temperature range. In other cases, it may be advantageous for the electrical power output to vary but to do so linearly with temperature. In certain cases, the materials of the present invention exhibit good levels of thermal power output.

It is an object of certain embodiments of this invention to provide thermoelectric materials which exhibit a higher ZT than prior art materials. Of course, the thermoelectric materials of the invention may exhibit roughly the same ZT or even a lower ZT than prior art materials but may offer other benefits as described above. In such circumstances, it may be acceptable for the novel material according to embodiments of the invention to have a lower absolute ZT value than known materials (while still being acceptable and able to provide usable electric power) if its various other advantages such as cost of goods and/or operating temperature range and/or handling characteristics e.g. toxicity.

This invention satisfies one, some or all of the above stated objectives.

BRIEF SUMMARY OF THE DISCLOSURE

In a first aspect of the present invention is provided a thermoelectric composite material comprising:
 a metal oxide material; and
 graphene or modified graphene.

For the purposes of the present invention, a thermoelectric material is defined as a material which is able to generate electrical power in response to a thermal gradient. A metal oxide or a mixed metal oxide may be doped to provide a thermoelectric material. The metal oxide material may be an n-type or p-type thermoelectric metal oxide material.

In the materials of the present invention, mobility of metal ions is considered to be disadvantageous and consequently fast ion conductors are not considered to be viable candidates for thermoelectric materials and are outside the scope of the invention. Thus, for example, a material such as lithium titanate would not be expected to be able to form a thermoelectric composite material in the manner envisaged by the invention. Thermoelectric materials are characterised by the availability of mobile electrons or holes (and not ions) which transport the electrical charge when a thermal gradient is applied to the material. In certain embodiments, the metal oxide material is preferably a material in which there is little ionic migration i.e. mobility of an ion as the conductive species, and most preferably it is a material in which there is no ionic migration. The graphene or modified graphene will preferably be dispersed throughout the metal oxide material (e.g. n-type or p-type thermoelectric metal oxide material).

Thus one embodiment of the invention provides a thermoelectric composite material comprising: a n-type or p-type thermoelectric metal oxide material; and graphene or modified graphene.

It has been found that the addition of graphene or modified graphene to thermoelectric metal oxide materials increases ZT. It has further been found that the ZT of the metal oxide becomes effective over a broader temperature range and at lower temperatures.

The present invention provide substantial improvements in the ZT value of the underlying thermoelectric metal oxide by doping with graphene or modified graphene. The exact mechanism by which this is achieved is not known. However, it is noted that the relative increase in the ZT value for these materials is several multiples better than any corresponding increase that can be found in the values of known materials. Thus, improvements in the ZT value in excess of 5 or 10 or 100 times as compared to the doped original thermoelectric material. In contrast, in the prior art, attempts at doping materials have not made any significant difference to the ZT value.

A further surprising benefit of some of the materials of the invention appears to reside in the fact that this improvement is manifested across a wide temperature range. For example, the present invention provides thermoelectric materials having operating temperatures which span several hundred degrees. Indeed, in some examples of the invention, materials demonstrate acceptable ZT values across more than 600° C. of temperature. Advantageously, certain materials according to the invention are able to exhibit acceptable ZT values extending to as low as 50° C., and some of those same materials are still able to provide a similar ZT level at 600° C. or 700° C. The ability to achieve an acceptable ZT value at a relatively low temperature such as 50° C. or 100° C. provide access to recovery of electrical power from thermal sources where it might not otherwise have been possible. Some materials of the present invention also show a substantially linear power generation response across a range of temperatures. This represents a large advantage in the materials of the invention because they may be used in a wide range of potential applications.

Furthermore, the smaller density of the materials of the invention compared with conventional thermoelectric materials enables lighter power generation devices to be produced. The materials of the invention have good power density and also exhibit a good thermal power output (the thermal power output is defined in p volts/K).

The metal oxide may be a simple binary compound, a mixed oxide in which the metal is in two or more oxidation states, or a mixed metal oxide. Any of these oxides may include a small amount, typically 15% by weight or less, of one or more metal dopants (e.g. a metal dopant). The one or each dopant metal may be a transition metal, an f-block metal or it may be a metal from Group I, group II or Group III. When present the total amount of dopant is in an amount from 0.01% to 15% by weight. Metals having a relatively small ionic radius are generally less preferred within the materials of the present invention because of the risk of ionic conduction and ionic mobility. Thus, amongst any of the group I, group II, or group III elements, taken individually, the preferred elements tend to be those present lower in the group such as strontium.

In an embodiment, the thermoelectric composite material comprises a n-type thermoelectric metal oxide material. In an alternative embodiment, the thermoelectric composite material comprises a p-type thermoelectric metal oxide material.

In an embodiment, the composite comprises graphene (i.e. pristine graphene).

In an alternative embodiment, the composite comprises modified graphene (e.g. functionalised graphene, e.g. oxidised or partially oxidised graphene).

In an embodiment, the metal oxide material is a nanostructured metal oxide material. Thus, the metal oxide material may be in the form of discrete metal oxide grains ranging in size from 1 to 100 nm.

In an embodiment, the graphene or modified graphene is in the form of flakes.

In an embodiment, the graphene or modified graphene are randomly distributed throughout the composite material.

In an alternative embodiment, the graphene or modified graphene are situated on the surfaces of the metal oxide material. In this embodiment, the graphene or modified graphene may be in the form of flakes arranged on the surface of the metal oxide material (i.e. the surfaces of the metal oxide nanocrystals), or alternatively it may be in the form of a coating on the surface of the metal oxide material (i.e. the surfaces of the metal oxide nanocrystals).

The graphene or modified graphene and the metal oxide material may form alternating layers. In other words the composite may be a layered material in which every other layer comprises graphene or modified graphene and the layers in between comprise the metal oxide. Thus, the composite may be a laminate, with alternating layers of metal oxide and graphene or modified graphene.

The metal oxide material is preferably selected from: $Ca_3Co_4O_9$, $Na_xCoO_2$, $Bi_2Sr_2Co_2O_x$, $SrTiO_3$, $CaMnO_3$ and $ZnO$, which may or may not include a dopant. In a particular embodiment, the metal oxide material is selected from $SrTiO_3$ and $Ca_3CoO_9$, which may or may not include a dopant.

In an embodiment, the metal oxide material is selected from: $SrTiO_3$, $CaMnO_3$ and $ZnO$, which may or may not include a dopant. In a particular embodiment, the metal oxide material is $SrTiO_3$, which may or may not include a dopant.

In an embodiment, the metal oxide material is selected from $Ca_3Co_4O_9$, $Na_xCoO_2$ (in which x is typically between about 0.5 and about 0.85), which may or may not include a dopant. In a particular embodiment, the metal oxide material is $Ca_3Co_4O_9$, which may or may not include a dopant.

In an embodiment, the metal oxide is not $Li_2TiO_3$.

In an embodiment, the metal oxide material includes a dopant.

In an embodiment, the thermoelectric composite material has a ZT greater than about 1 (e.g. greater than about 0.5 or greater than about 0.2) at a temperature over 450° C. Such materials are particularly effective in power generation applications. In a further embodiment, the thermoelectric composite material has a ZT greater than about 1 (e.g. greater than about 0.5 or greater than about 0.2) at a temperature over 550° C. In another embodiment, the thermoelectric composite material has a ZT greater than about 1 (e.g. greater than about 0.5 or greater than about 0.2) at a temperature or range of temperatures which falls within the range 450° C. and 1000° C. In yet another embodiment, the thermoelectric composite material has a ZT greater than about 1 (e.g. greater than about 0.5 or greater than about 0.2) at a temperature or range of temperatures which falls within the range 600° C. to 700° C.

Current oxide thermoelectric materials and many non-oxide thermoelectric materials known in the art cease to be effective (e.g. have a ZT greater than about 1 (e.g. greater than about 0.5 or greater than about 0.2)) over 450° C. For many applications, including in heat recovery in furnaces and in power plants, a thermoelectric material needs to be effective at temperatures of around 600° C. and 700° C.

In the case of automobile exhaust systems, the operating temperature range is typically 450° C. to 600° C. The present invention can provide materials having an acceptable ZT across a range of temperature, including this range, and consequently is able to provide materials having an acceptable ZT value for use in such applications.

In an embodiment, the thermoelectric composite material has a ZT greater than about 1 (e.g. greater than about 0.5 or 0.2) at a temperature of from 0° C. to 550° C. Such materials are particularly effective in cooling applications. In a further embodiment, the thermoelectric composite material has a ZT greater than about 1 (e.g. greater than about 0.5 or 0.2) at a temperature of from 0° C. to 450° C.

The graphene or modified graphene may be present at an amount less than the percolation limit. The graphene or modified graphene may be present at an amount from 0.001 to 5 wt % of the composite. Preferably the graphene or modified graphene is present at an amount 0.01 to 2 wt % or even 0.05 to 1 wt % of the composite. These values are particularly preferred for embodiments in which the graphene is dispersed throughout the thermoelectric material.

In a second aspect of the invention is provided a thermoelectric device comprising two or more thermoelectric units; wherein
at least one thermoelectric unit is a p-type unit and at least one thermoelectric unit is a n-type unit; wherein the thermoelectric units are in electrical contact with one another and wherein at least one thermoelectric unit comprises:
  a metal oxide material (e.g. an n-type or p-type thermoelectric metal oxide material); and
  graphene or modified graphene.

The graphene or modified graphene will preferably be dispersed throughout the thermoelectric metal oxide material in the thermoelectric unit. Thus, the second aspect may provide a thermodynamic device comprising two or more thermoelectric units; wherein
at least one thermoelectric unit is a p-type unit and at least one thermoelectric unit is a n-type unit; wherein the thermoelectric units are in electrical contact with one another and wherein at least one thermoelectric unit comprises a thermoelectric composite material of the first aspect.

Thermoelectric devices according to the invention may be used in the conversion of heat energy to electrical power. They may be used for power generation in remote sites (e.g. oil and gas rigs, lighthouses), perhaps in conjunction with a heat source such as a radioactive material. They may also be used to convert waste heat energy into electrical power. Thus, they may be used to capture energy lost as heat from motor vehicles, incinerators, furnaces, power plants, refineries and other manufacturing processes.

Alternatively, the thermoelectric device may be used in cooling. In such embodiments, the device further comprises a power source.

In an embodiment, the thermoelectric device comprises a single p-type unit. In another embodiment, the thermoelectric device comprises a single p-type unit. In a further embodiment, the thermoelectric device comprises a single p-type unit and a single n-type unit. Alternatively, the thermoelectric device comprises a plurality of p-type units and a plurality of n-type units.

In an embodiment, the at least one (e.g. the single) p-type unit comprises a p-type thermoelectric metal oxide material; and graphene or modified graphene. In an embodiment, the at least one (e.g. the single) p-type unit comprises a p-type thermoelectric metal oxide composite material as described in the first aspect of the invention.

In an embodiment, the at least one (e.g. the single) n-type unit comprises a n-type thermoelectric metal oxide material; and graphene or modified graphene. In an embodiment, the at least one (e.g. the single) n-type unit comprises a n-type thermoelectric metal oxide composite material as described in the first aspect of the invention.

The at least one (e.g. the single) n-type unit or the at least one (e.g. the single) p-type unit or both may comprise graphene. Alternatively, the at least one (e.g. the single) n-type unit or the at least one (e.g. the single) p-type unit or both may comprise functionalised graphene.

In embodiments in which both the n-type unit and the p-type unit both comprise graphene or modified graphene, the units may comprise differentially functionalised graphene. Thus, one unit may comprise pristine graphene and the other may comprise a functionalised graphene.

In an embodiment, the at least one (e.g. the single) p-type unit comprises a p-type thermoelectric metal oxide material; and graphene or modified graphene and the at least one (e.g. the single) n-type unit comprises a n-type thermoelectric metal oxide material; and graphene or modified graphene.

In embodiments in which the device comprises a plurality of n-type and/or p-type units, each unit may comprise a different material. Thus, the units may be arranged in series. In this embodiment it may be that the units each comprise a different material. This allows for an arrangement in which with those units which comprise a material with a good ZT at high temperatures are positioned closer to the heat source and those units which comprise a material with a good ZT value at lower temperatures are positioned further away from the heat source.

In an embodiment, at least one of the two or more thermoelectric units is sealed in an inert atmosphere. In an embodiment, all of the thermoelectric units are sealed in an inert atmosphere. In an embodiment, all of the thermoelectric units which comprise graphene or modified graphene are sealed in an inert atmosphere.

In a third aspect of the invention, is provided a method of making a thermoelectric composite material, the thermoelectric material comprising:
  a metal oxide material (e.g. n-type or p-type thermoelectric metal oxide material); and
  graphene or modified graphene;
the method comprising:
  combining the metal oxide material (e.g. n-type or p-type thermoelectric metal oxide material) with the graphene or modified graphene.

This method can be used to provide the composite materials of the first aspect of the invention. Materials made by this method may also find application in the devices of the second aspect of the invention.

In an embodiment, the step of combining the n-type or p-type thermoelectric metal oxide material with the graphene or modified graphene comprises mixing the n-type or p-type thermoelectric metal oxide material and the graphene or modified graphene. In a further embodiment, the n-type or p-type thermoelectric metal oxide material and the graphene or modified graphene are mixed in a slurry to form a mixture.

In an embodiment, the method further comprises, after the mixing step, the step of pressing the mixture to form a pellet. In a further embodiment, the method further comprises the step of sintering the pellet.

In an embodiment, the step of combining the n-type or p-type thermoelectric metal oxide material with the graphene or modified graphene comprises depositing the n-type or p-type thermoelectric metal oxide material onto the graphene or modified graphene. In an embodiment, the method comprises forming the n-type or p-type thermoelectric metal oxide material into a sol-gel and coating the graphene or modified graphene. In a further embodiment, the method comprises, sintering the coated graphene or modified graphene.

Sintering will typically be conducted in the presence of an inert gas at high temperature. Sintering may be conducted in the presence of a small amount of hydrogen, e.g. in the presence of an inert gas (e.g. Ar) containing from 0.1 to 10% $H_2$, at high temperature. The presence of $H_2$ prevents or reduces the oxidation of graphene. Alternatively, sintering may be conducted in the absence of $H_2$. Typically a sintering temperature will be greater than 800° C., e.g. from 1000 to 2000° C., e.g. from 1300-1600° C.

Where it is a pellet that is sintered, the pellet may be coated beforehand. Thus, the pellet may be coated with the metal oxide or a mixture of the metal oxide and an additive (e.g. graphite nanoparticles).

In an embodiment, the step of combining the n-type or p-type thermoelectric metal oxide material with the graphene or modified graphene comprises depositing the graphene or modified graphene onto the n-type or p-type metal oxide material (e.g. thermoelectric metal oxide material), e.g. depositing the graphene or modified graphene onto particles of the n-type or p-type metal oxide material (e.g. thermoelectric metal oxide material) and milling or grinding the particles to form a mixture.

In an embodiment, the deposition is electrodeposition.

In a further embodiment, the deposition is electrostatic precipitation. In the present context electrostatic precipitation involves charging the graphene or modified graphene and the n-type or p-type metal oxide material (e.g. thermoelectric metal oxide material) with opposite charges, encouraging them to aggregate together upon precipitation.

In an alternative embodiment, the deposition is electrophoretic deposition. Electrophoretic deposition refers to a process where charges are deposited onto a substrate electrode through an electric field.

In another alternative method, the deposition is chemical vapour deposition.

In an embodiment, the method includes the step of providing a metal oxide material (e.g. n-type or p-type thermoelectric metal oxide material). In another embodiment, the method includes the step of providing graphene or modified graphene.

It may be that the graphene or modified graphene is graphene and the step of providing the graphene comprises obtaining graphene by liquid phase exfoliation. Thus, the graphene may be obtained by surfactant assisted solvent exfoliation or pyrene sulfonic acid assisted solvent exfoliation.

Any of the embodiments described above for any one aspect of the invention apply equally to any other aspect of the invention and can be combined with any other embodiment.

BRIEF DESCRIPTION OF THE DRAWINGS

Embodiments of the invention are further described hereinafter with reference to the accompanying drawings, in which.

DETAILED DESCRIPTION

An oxide material comprises one or more transition metal and/or other elemental (e.g. metallic) species and oxygen. Many of the thermoelectric metal oxide materials which can be used in the present invention are mixed metal oxides, but this is not exclusively the case. The metal oxide may be a mixed oxide in which the metal is in two or more oxidation states. The oxides of the invention may be doped. It is well known in the art that the properties (including the thermoelectric properties) of metal oxides can be modified using dopants. Doping a metal oxide may involve replacing a small proportion of the component metal ions with one or more alternative metal ions (i.e. replacing 1%, 2%, 5%, 10% or 15% or more of one of the component metal ions of the oxide with another metal). When present the dopant is in an amount from 0.01% to 15% by weight. The oxides, doped or otherwise, which are suitable for use in the present invention are those which have shown some thermoelectric properties. For an illustration of the range of oxide/dopant combinations which could be used in the present invention see Koumoto et al. Thermoelectric Ceramics for Energy Harvesting. *J. Am. Ceram. Soc.*, 1-23, 2012; Fergus, Oxide Materials for high Temperature Thermoelectric Energy conversion, *Journal of the European Ceramic Society*, 32, 525-540, 2012). Throughout this specification, unless specifically indicated otherwise, the term 'metal oxide' includes mixed metal oxides, doped oxides and doped mixed metal oxides.

The metal oxides of the invention may be in the form of a nanostructured metal oxide. Nanostructured metal oxides can be broadly defined as solids composed of discrete metal oxide particles that exist in a variety of shapes (for example spheres and clusters) ranging in size from 1 to 100 nm. Without wishing to be bound by theory it is believed that the use of nanostructured oxides offers improved thermoelectric properties as phonons (i.e. heat energy) are dispersed/deflected when they reach the boundaries between nanoparticles in a nanostructured solid material. This may result in a reduction in the thermal conductivity of the material, leading to a higher ZT than might be obtained from the same material which is not nanostructured.

The thermoelectric metal oxides of the invention may be either n-type metal oxides or p-type metal oxides.

n-Type thermoelectric metal oxides are those in which there is an excess of electrons. In thermoelectric power generation the electrons move from the warmer portion of the material to the cooler portion of the material. Exemplary n-type oxides include: $SrTiO_3$, $CaMnO_3$ and $ZnO$.

p-Type thermoelectric metal oxides are those in which there is an excess of electron holes. In thermoelectric power generation the holes move from the warmer portion of the material to the cooler portion of the material. One class of p-type metal oxides which can be used in the invention comprise cobalt, often in combination with an alkali or alkali earth metal. Exemplary p-type metal oxides include $Ca_3Co_4O_9$, $Na_xCoO_2$ (in which x is typically between about 0.5 and about 0.85), LaCoO, CuAlO$_2$ and LaCuO$_4$. Preferred p-type metal oxides include Ca$_3$CoO$_9$ and Na$_x$CoO$_2$.

Exemplary dopants which may be present in the metal oxides (whether p-type or n-type) of the invention include: La, Yb, Sm, Gd, Dy, Ca, Ba, Nb, Ta, Nd, Y, Pr, Ce, Al, Lu, Bi, Ni, Ti, Sn, Sb, Ag, Cu, Fe, Mn, Rh, Pb, Ga, Eu, Ho, Er, Na, K, Sr, Mg, Zn. The metal oxides may be doped with any one of these dopants or alternatively, the metal oxide may be doped with any one or more of these dopants.

Dopants which are particularly suited to use with SrTiO$_3$ include: La, Yt, Sm, Gd, Dy, Ca, Ba, Nb, Ta, Nd and Y. Dopants which are particularly suited to use with CaMnO$_3$ include: Yb, Nb, Ta, Dy, Pr, La, Yb, Ce, Al, Sm, Gd, Lu, Bi. Dopants which are particularly well suited to use with ZnO include: Al, Ni, Ti, Sn, Sb. Dopants which are particularly well suited to use with Ca$_3$Co$_4$O$_9$ include: Bi, Ag, Cu, Fe, Mn, Ti, Ni, Rh, Ta, Pb, Ga, La, Nd, Eu, Ho, Dy, Er, Yb, Lu, Gd, Na, Na+Mn, K+La, Ba, Sr, Y. Dopants which are particularly well suited to use with Na$_x$CoO$_2$ include: Ag, Cu, Ni, Zn, Sr, K, Nd. Dopants which are particularly suited to use with LaCoO include: Sr, Rh, Ni. Dopants which are particularly suited to use with CuAlO$_2$ include: Mg, Ag, Zn.

Table 1 shows the preferred stoicheometric range for selected dopants for SrTiO$_3$:

|    | from | to   |
|----|------|------|
| La | 0.05 | 0.12 |
| Yt | 0.01 | 0.1  |
| Sm | 0.01 | 0.1  |
| Gd | 0.01 | 0.1  |
| Dy | 0.01 | 0.1  |
| Ca | 0    | 1    |
| Ba | 0    | 1    |
| Nb | 0.15 | 0.2  |
| Ta | 0.01 | 0.1  |
| Nd | 0    | 0.1  |
| Y  | 0.05 | 0.1  |

Table 2 shows the preferred stoicheometric range for selected dopants for CaMnO$_3$:

|    | from | to   |
|----|------|------|
| Yb | 0.1  | 0.2  |
| Nb | 0.02 | 0.1  |
| Dy | 0.05 | 0.1  |
| La | 0    | 0.2  |
| Yb | 0.05 | 0.1  |
| Sm | 0.02 | 0.1  |
| Gd | 0.02 | 0.1  |
| Lu | 0.2  | 0.1  |
| Bi | 0    | 0.19 |

The preferred stoicheometric range for Al when used as a dopant for Zn is between 0.02 and 0.03.

Table 3 shows the preferred stoicheometric range for selected dopants for Ca$_3$Co$_4$O$_9$:

|    | from | to   |
|----|------|------|
| Bi | 0.05 | 0.5  |
| Ag | 0.2  | 0.3  |
| Cu | 0    | 0.1  |
| Fe | 0    | 0.1  |
| Mn | 0    | 0.1  |
| Ga | 0    | 0.05 |
| Nd | 0    | 0.3  |
| Eu | 0    | 0.3  |

-continued

|        | from | to   |
|--------|------|------|
| Ho     | 0    | 0.1  |
| Lu     | 0    | 0.1  |
| Gd     | 0    | 0.25 |
| Na     | 0    | 0.05 |
| K + La | 0    | 0.1  |
| Y      | 0    | 0.3  |

Table 4 shows the preferred stoicheometric range for selected dopants for Ca$_3$Co$_4$O$_9$:

|    | from | to   |
|----|------|------|
| Ag | 0    | 0.1  |
| Ni | 0    | 0.1  |
| Sr | 0.1  | 0.15 |
| K  | 0.05 | 0.2  |

The ZT of a thermoelectric material depends on three factors: the Seebeck coefficient of the material, the electrical conductivity and the thermal conductivity. The introduction of a dopant into a metallic oxide frequently affects more than one or even all three of these properties. Thus, a dopant may increase the Seebeck coefficient of an oxide but reduce the electrical conductivity. For this reason the nature and preferred amount of a dopant cannot be defined more specifically than to say that a dopant may be present.

A layer of graphene consists of a sheet of sp$^2$-hybridized carbon atoms. Each carbon atom is covalently bonded to three neighboring carbon atoms to form a 'honeycomb' network of tessellated hexagons. Carbon nanostructures which have more than 10 graphene layers (i.e. 10 atomic layers; 3.5 nm) generally exhibit properties more similar to graphite than to mono-layer graphene. Thus, throughout this specification, the term graphene is intended to mean a carbon nanostructure with up to 10 graphene layers. Graphene is often referred to as a 2-dimensional structure because it represents a single sheet or layer of carbon of nominal (one atom) thickness. Graphene can be considered to be a single sheet of graphite.

The graphene used in the invention may be pristine graphene or it may be modified. The thermoelectric materials of the invention may comprise a mixture of differentially functionalised graphene, e.g. a mixture of pristine graphene and one or more functionalised graphenes, or two or more differentially functionalised graphenes. One form of modified graphene is functionalised graphene. Graphene may be functionalised in the same way in which carbon nanotubes are modified and the skilled person will be familiar with the various synthetic procedures for manufacturing functionalised carbon nanotubes and could readily apply these techniques to the manufacture of modified graphene. This may include functionalisation with halogen (e.g fluoro and/or chloro atoms) and/or functionalisation with oxygen-containing groups (e.g. carboxylic acids, hydroxides, epoxides and esters etc). Oxidised graphene may mean graphene oxide, partially oxidised graphene or partially reduced graphene oxide.

Chemical functionalisation of the graphene may assist in the manufacturing of the graphene metal oxide composite. If the graphene metal oxide composite is made by simple mixing of the graphene and the metal oxide, the functionalisation of the graphene (e.g. partial oxidation of the graphene) may, for example, improve the distribution of the graphene in the slurry medium material.

The graphene or modified graphene may be single layer. Alternatively, it may be multilayer graphene, i.e. from 1-10 layers thick. Depending on the method of formation of the graphene the graphene may well have a distribution of layers within each particle (e.g. flake) of graphene. When considered in bulk the graphene may well have a distribution of layers. It may be that over 90% by weight of the graphene is in a form which is from 1-10 layers thick. It may be that over 80% by weight of the graphene is in a form which is from 1-10 layers thick. It may be that over 70% by weight of the graphene is in a form which is from 1-10 layers thick. It may be that over 50% by weight of the graphene is in a form which is from 1-10 layers thick. If the graphene is predominantly single layer graphene it may be that over 90% of the graphene is single layer graphene. It may be that over 80% by weight of the graphene is single layer graphene. It may be that over 70% by weight of the graphene is graphene is single layer graphene. It may be that over 50% by weight of the graphene is graphene is single layer graphene.

Without being bound by theory, it is believed that the graphene or modified graphene increase the electrical conductivity of the oxides without significantly increasing the thermal conductivity and thus produce materials which possess all the benefits of the oxide materials (low density, low costs, low toxicity) with improved ZT values. The graphene or modified graphene used in the invention may have a plurality of boundaries (i.e. places where the delocalised layer structure of a graphene sheet discontinues). Electrons can pass (jump) across such boundaries but phonons (i.e. heat energy) are dispersed and/or reflected at such boundaries.

The upper limit of the amount of graphene a composite can contain varies significantly based on the way in which the graphene is distributed in the metal oxide and the nature of the graphene or modified graphene and the metal oxide. The upper limit is determined by percolation. Percolation in composites is the formation of a connected pathway of the reinforcement phase (in this case the graphene or modified graphene) through the sample. The concentration that this pathway is formed at is known at the percolation threshold. The formation of the percolated network is typically associated with a step increase in one or more properties of the composite, for example electrical conductivity, thermal conductivity or modulus. Above the percolation threshold, these properties will then increase more gradually as the concentration is increased. The concentration of reinforcement at which percolation will occur depends on particle size, orientation and crucially of it is randomly distributed. (For more information see the book "An Introduction to Percolation theory" by D. Stauffer & A. Aharony.)

In the case of the composites herein, if a conductivity graphene pathway is created through the material then the current will take the path of least resistance, bypass the active thermoelectric and short the device. Thus it is important to avoid the formation of such a pathway. Approaches to achieve this include but are not limited to:
1. In the case of a composite containing randomly distributed graphene using a graphene concentration beneath the percolation threshold.
2. To non-randomly arrange the graphene.
3. Coat the graphene in the thermoelectric The composites of the invention exhibit an optimal ZT at a variety of temperatures, depending on the metal oxide upon and the graphene or modified graphene and the way in which the two materials are combined.

Some of the composites of the invention exhibit optimal ZT values across a very broad temperature range. This in itself is a desirable property as it allows the active portion of the thermoelectric device to extend along a greater portion of the temperature gradient, thus allowing a greater proportion of the heat released to be converted to electricity by a single device. It also allows the position of the device to be less critical to its optimal performance allowing use in systems where the temperature of the heat source is variable or where the components of the system are necessarily attached to moving parts.

Specific potential applications for graphene composite thermoelectric materials of the present invention are as follows:

| Applications | Operating Temperatures |
| --- | --- |
| Aerospace applications: radioisotope thermoelectric generators (RTG). Power requirement (1-3 kW) | 1273 K-573 K Can utilise cascaded systems for 1273 K-300 K |
| Automotive applications: Waste heat recovery from exhaust systems | 600 K-300 K |
| Power plants and cogeneration: Can be used coupled with heat exchangers and boilers | 1100 K-300 K For various systems within this range. |
| Power plants: sensors | Engineered around the range to be operated. |
| Solar TEGs | 700 K-300 K |
| Hybrid solar thermoelectric system | 1200 K-700 K 776 K-300 K |
| Defence systems: Waste heat recovery | 723 K-350 K 400 K-300 K |
| Bio-compatible circuits | |
| Thermoelectric cooler applications: To cool electronic board packages. Use as solid state HVAC systems. | 500 K-300 K |
| Other applications: Power required is few microwatt, e.g. wrist watches | 300 K |

Space Applications

RTG Systems: Radioisotope based power sources have been used to power about the last 26 missions including Mars Rover 'curiosity'. Voyager missions used multi-hundred-watt (MHVV) RTG. The MHW-RTG used 312 silicon-germanium (SiGe) thermoelectric couples. The thermoelectric composites of the present invention could also find use in such applications.

Automotive Applications

BiTe and Skutteridite based thermoelectric materials have been used in automotive applications. The objective would be to achieve 5% conversion efficiency and fuel economy of 1 miles/gallon. The maximum exhaust mass flow is at about 450° C.-600° C.

Solar TEGs: high conversion of conversion efficiency of 10% is proposed in multi stage models by Xiao. With improved and uniform ZT in graphene composite thermoelectrics, they could be beneficial in medium temperature ranges.

Thermoelectric power systems for power generation from Battlefield Heat Sources have been proposed. The operating range is 75° C. to 450° C. Waste heat can be recovered from a variety of deployed equipment (i.e., diesel generators/engines, incinerators, vehicles, and potentially mobile kitchens), with the ultimate purpose of obtaining additional power for battery charging, advanced capacitor charging, and other battlefield power applications.

Hybrid solar thermoelectric systems model have been proposed which concentrate the sun's radiation onto tubular thermoelectric modules with operating temperatures of 900-1200 K. The cold junction is maintained by thermosyphoning, using a coolant circuit with conjunction of a bottoming cycle of up to 776 K to achieve maximum efficiency. Further cascading of stable thermoelectric materials would enhance the electricity generation in the condenser section.

Thermoelectric Cooler Applications

Electronic Board Packages: When multi cored processors do not have enough means to dissipate the heat flux, stable and safe thermoelectrics operating in the medium temperature range up to 300° C. can be applied in combination with air cooling or liquid cooling approaches for continued performance in the systems.

Microclimate cooling (MCC) systems, can remove a significant amount of heat from a soldier's body while soldier is wearing combat clothing using thermoelectric devices, thus increasing mission duration and enhancing mission performance Other low temperature, low energy thermoelectric applications are possible such as for powering wrist watches, using temperature difference of few deg C., rather than using batteries.

Low temperature non toxic and Bio-compatible Sensors, IR, fluid flow sensors can also be based on graphene thermoelectric composite TEGs.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

EXAMPLES

General Procedures 1 and 2 describe generally applicable procedures for making thermoelectric materials which can be used to form the composite materials of the invention. A mixed oxide route is exemplified using strontium titanate and a chemical (solution) route is exemplified using calcium cobaltite. Either method can be applied to either material, and indeed either method can be applied to any of the mixed metal oxides and doped mixed metal oxides mentioned in this specification. The metal oxide materials made by these methods are likely to be nanostructured. The chemical (solution) routes such as that provided in General Procedure 2 are preferred as they give higher purity products and generally better control over particle size (providing smaller particle sizes in the final products if so desired).

Examples 1-6 describe methods of making some specific n- and p-type oxides which can be used to form the composite materials of the invention. These procedures were taken from the following publications: High-temperature electrical transport behaviors in textured $Ca_3Co_4O_9$-based polycrystalline ceramics, Yuan-Hua Lin, Jinle Lan, Zhijian Shen, Yuheng Liu, Ce-Wen Nan and Jing-Feng Li, Applied Physics Letters 94, 072107 (2009); Thermoelectric ceramics for generators, J. G. Noudem, S. Lemonnier, M. Prevel, E. S. Reddy, E. Guilmeau, C. Goupil, Journal of the European Ceramic Society 28 (2008) 41-48; Comparison of the high temperature thermoelectric properties for Ag-doped and Ag-added $Ca_3Co_4O_9$, Yang Wang, Yu Sui, Jinguang Cheng, Xianjie Wang, Wenhui Su, Journal of Alloys and Compounds, 477 (2009) 817-821; Thermoelectric Properties of Y-Doped Polycrystalline $SrTiO_3$, Haruhiko Obara, Atsushi Yamamoto, Chul-Ho Lee, Keizo Kobayashi, Akihiro Matsumoto[1] and Ryoji Funahashi, Japanese Journal of Applied Physics, Vol. 43, No 4B, 2004, pp. L540-L542; Thermoelectric properties of n-type double substituted $SrTiO_3$ bulk materials, Yanjie Cui, Jian He, Gisele Amow and Holger Kleinke, Dalton Trans., 2010, 39, 1031-1035; Doping Effect of La and Dy on the Thermoelectric Properties of $SrTiO_3$, Hong Chao Wang, Chun Lei Wang, Wen Bin Su, Jian Liu, Yi Sun, Hua Peng, and Liang Mo Mei, J. Am. Ceram. Soc., 94[3] 838-842 (2011).

General Procedures 3-5 provide generally applicable procedures for making the oxide/graphene (or modified graphene) composites of the invention. These procedures are suitable for forming composites of any of the ceramics (i.e. metal oxides) described in this specification.

General Procedure 6 gives information on how ZT may be calculated for the composites of the invention.

General Procedure 1: Preparation of Strontium Titanate: Mixed Oxide Route

Strontium titanate (hereafter STO) ceramics are produced using the standard mixed oxide method. An excess of any hygroscopic powders are dried in a furnace at an appropriate temperature to remove any water mass that would affect subsequent weighing. The powders of strontium carbonate and titanium dioxide are then weighed in stoichiometric ratios and put into a plastic bottle for mixing. For doped STO the appropriate molar content of the strontium, titanium, or both are removed and replaced with the desired amount of dopant. 8 mm zirconia balls and propan-2-ol added in a 1:1:1 ratio to create a slurry for the wet milling process. The bottle is sealed and secured in a vibratory mill for 18 hours. After milling the slurry is dried in an oven until the propan-2-ol had completely evaporated.

The milled powders are transferred to an alumina crucible for calcination and heated in a furnace for 4 hrs at 1373 K with a heating/cooling rate of 180 K hr$^{-1}$. The calcined powders were again milled under the same conditions as previously stated. The final powders were then pressed into 10 mm and 20 mm diameter pellets with a pressure of 25 MPa. The pressed STO pellets were sintered at 1733 K for 4 hours in either an air or reducing atmosphere.

General Procedure 2: Preparation of Calcium Cobaltate: Co-Precipitation Method

Calcium cobaltite (hereafter CCO) ceramics are produced by precipitating out the metals from a solution. The calcium nitrate and cobalt nitrate are weighed in stoichiometric ratios and dissolved together in distilled water with a ratio of 1 g:10 ml with a magnetic stirrer. If doping the ceramic, the appropriate molar content of the calcium, cobalt, or both are removed and replaced with the desired amount of dopant. This solution is then transferred to a dropping funnel. An appropriate amount 0.1 M sodium hydroxide is added to a beaker. Stir the NaOH solution with a magnetic stirrer and add dropwise the metal solution to the edge of the vortex created by the stirrer. The solution must remain above pH 13 for the reaction to occur.

After the reaction has completed, the precipitate must be extracted. The suspension is poured into a Buchner funnel with a water pump attached and a fine filter paper in place. The precipitate is filtered out and its pH is measured. The precipitate is washed and refiltered until the pH is less than 8. This is then dried in an oven. Once dry, it is transferred into an alumina crucible and calcined at 1050 K for 10 hours heating/cooling rate of 180 K hr$^{-1}$. The final powders were then pressed into 10 mm and 20 mm diameter pellets with a pressure of 25 MPa. The pressed CCO pellets were sintered at 1170 K for 6 hours in an air atmosphere.

Example 1

$Ca(NO_3)_2$, $Co(NO_3)_2 \cdot 6H_2O$, $La(NO_3)_3 \cdot 6H_2O$, and citric acid can be used as raw materials. Mixtures of the above ingredients in the appropriate proportions to provide nominal compositions of $Ca_3Co_4O_9$ and $(La_{0.1}Ca_{0.9})_3Co_4O_9$ can be thoroughly dissolved in distilled water, respectively, and then heated to form a transparent gel. The dried gel can be ground and calcined at 800° C. for 2 h to form the precursor powders. The ceramic bulk samples can be compacted in vacuum in a SPS apparatus. The powder precursors were sintered by spark plasma sintering (SPS) method at 900° C. for 5 min. The samples can then be forged in the same SPS apparatus by loading 750° C. predensified cylindrical samples with a diameter of 15 mm and a height of 5 mm into a die with inner diameter of 20 mm and heated up with a heating rate of 100° C./min in vacuum to the preset deformation temperature of 900° C. A constant uniaxial load that corresponded to an initial compressive stress of 40 Mpa can be applied when reaching the preset temperature and held there for 5 min. For the SPS processing, the precursor powders can be placed in a special graphite die, with some carbon being diffused into the samples surface. Therefore, the obtained samples can be annealed at 700° C. under an O2 atmosphere in order to eliminate the carbon on the surface completely.

Example 2

Ceramic powders with nominal compositions $Ca_3Co_4O_9$ (p-type) and $Ca_{0.95}Sm_{0.05}MnO_3$ (n-type) can be synthesized from stoichiometric amounts of $CaCO_3$, $Co_3O_4$, $Sm_2O_3$ and $MnO_2$ by "solid state reaction". The precursor powders can be mixed and calcinated twice at 900° C., for 12 h with intermediate grindings to obtain a homogeneous composition. The mixture powder can be first formed into a cylindrical pellet (24 mm diameter) or bars 4 mm×4 mm×35 mm) under 30 MPa using a compacting cell. The cobaltite samples can be sintered in air at 920° C., for 24 h. Polyvinyl alcohol can be used as a binder in the case of the manganite compaction due to the coarser starting particle size. The processing temperature of the n-type material can be 1350° C., 12 h. A platinum plate should be used between the sample and $Al_2O_3$ crucible to prevent the reaction between the material and the support.

Example 3

For Ag-doped $Ca_{3-x}Ag_xCo_4O_9$ (x=0, 0.1 and 0.3) polycrystalline samples, reagent grade $CaCO_3$, $Co_2O_3$ and $AgNO_3$ powders in the stoichiometric ratio can be mixed thoroughly and calcined in air at 1173 K for 12 h. Then the mixture can be reground, pressed into pellets and sintered at 1173 K for 36 h under an O2 flow with an intermediate grinding. The pellets can be pulverized manually for 1 h, and then the powders were cold pressed into disc-shaped pellets under a high pressure of 3 GPa with a special die. Finally, the above pellets can be sintered under O2 flow at 1173 K for 12 h.

For Ag-added $Ca_3CO_4O_9$ ceramic composites, the prepared $Ca_3Co_4O_9$ powders can be mixed with $Ag_2O$ powders in three different weigh ratios to $Ca_3Co_4O_9$:3.5 wt %, 10 wt % and 20 wt %. (The Ag element concentration of 3.5 wt % and 10 wt % Ag-added samples will be equal to that of x=0.1 and 0.3 Ag-doped samples, respectively.) The mixed powders can also be cold pressed under 3 GPa and then sintered at 1173 K for 12 h. The decomposition temperature of $AgO_2$ is ~573 K, above which $AgO_2$ decomposes into Ag metal and oxygen, so in the sintering process the produced Ag metal particles will mix with $Ca_3Co_4O_9$ grains thoroughly. Consequently, Ag metal will exist at $Ca_3Co_4O_9$ grain boundaries after sintering. By the same method, Ag 10 wt %-added $Ca_{2.7}Ag_{0.3}Co_4O_9$ ceramic composite can also be synthesized.

Example 4

$Sr_{1-x}Y_xTiO_3$ with x is up to 0.1 can be prepared by taking an appropriate stoichiometric mixture of $SrCO_3$, $TiO_2$, and $Y_2O_3$ and grinding and calcining several times at 1400° C. in air and Ar. Finally, the powders obtained can be repressed into pellets and sintered at 1400° C. for 1 h using the hot pressing technique under a pressure of 100 MPa in a flow of Ar. The colour of all samples was dark grey, indicating the reduced state of the material.

Example 5

A series of La, Ta double substituted $Sr_{1-x}La_xTi_{1-x}Ta_xO_3$ with x=0.01, 0.05, 0.10, La, Ta double substituted $Sr_{0.9}La_{0.1}Ti_{0.9}Ta_{0.1}O_3$ can be prepared. Starting materials were $SrCO_3$ and binary oxides, i.e. $La_2O_3$, $Nb_2O_5$, $Ta_2O_5$, $Ti_2O_3$, and $TiO_2$. To avoid the formation of highly oxidized products, i.e. containing only $Ti^{+4}$ and $Nb/Ta^{+5}$, the reactions can be carried out under dynamic high vacuum of the order of $10^{-6}$ mbar in $Al_2O_3$-based crucibles. In each case the mixtures can be thoroughly ground, and then calcined at 1200° C. over a period of 16 hours under dynamic high vacuum. Next, the products can be ground again, and reheated at least once at 1500° C. for 16 hours, again under dynamic high vacuum.

Example 6

Ceramic samples of $La_{0.1-x}Dy_{0.1+x}Sr_{0.8}TiO_3$ with x=0.02, 0.05, 0.08, and 0.10 can be prepared by conventional solid-state reaction techniques. The starting materials are $La_2O_3$, SrCO₃, TiO₂, and Dy₂O₃. These raw materials can be weighed in stoichiometric proportions and mixed by ball milling in ethanol with zirconia balls for 12 h. After the wet mixtures dried, they can be pressed into pellets and calcined at 1350° C. for 6 h in air. The pellets were smashed and ball milled for 12 h to obtain a fine powder. Then, the powder was repressed into pellets and sintered at 1460° C. for 4 h to form gas with 5 mol % hydrogen in argon.

General Procedure 3: Graphene Oxide-Oxide Composite Through the Co-Precipitation Method An aqueous graphene oxide solution is made using a modified Hummer's route as described in s described in The Real Graphene Oxide Revealed: Stripping the Oxidative Debris from the Graphene-like Sheets Rourke et al, Angewandte Chemie International Edition, 50(14), 3173-3177, 2011. In this example, no base wash is applied so that the graphene oxide remains soluble in water. Following the procedure described in Example 1, $Ca(NO_3)_2$, $Co(NO_3)_2 \cdot 6H_2O$, $La(NO_3)_3 \cdot 6H_2O$, and citric acid are then added to this graphene oxide solution in appropriate ratios to give a 5 wt % carbon loading the final ceramic-carbon composite. The rest of procedure as described in Example 1 is followed, with the exception of the calcination temperature being reduced to 500 deg C., followed by a high temperature anneal at 800 deg C. under an inert atmosphere.

General Procedure 4: Graphene-Ceramic Composites Through Mixing

A solution of graphene flakes in NMP are prepared by ultrasounding graphite in NMP for 24 hours, followed at centrifugation at 10,000 rpm and keeping the supernatant. Ceramic particles as made in any of the above examples are mixed into to the graphene solution to give a 1:5 ratio of carbon:oxide particles by mass. The NMP is evaporated away and resultant powder is pressed into a pellet. Optionally a binder such as poly-vinyl alcohol or PVDF may be added to hold the pressed powder together. The pellet may also be sintered in an inert atmosphere at 400 deg C.

Alternatively base-washed graphene oxide made as described by Rourke et al (The Real Graphene Oxide Revealed: Stripping the Oxidative Debris from the Graphene-like Sheets Rourke et al, Angewandte Chemie International Edition, 50(14), 3173-3177) could be used instead of graphene.

General Procedure 5: Graphene Oxide-Ceramic Composites by Electrostatic Colloidal Deposition Aqueous graphene oxide solutions are prepared as described in General Procedure 3. These graphene flakes have a negative charge. In a separate beaker, ceramic particles are prepared by any of the methods previously described and dispersed in water using a positively charged surfactant.

The solutions can be mixed in the required ratio and the graphene oxide particles gel with the ceramic particles through the electrostatic interactions. These gels are then dried and sintered.

In another alternatively, layer-by-layer assembled can be used. This is where a substrate is alternately dipped in the graphene oxide solution, then the ceramic solution, the graphene oxide solution etc, until the required thickness is obtained.

General Procedure 6: Measurement of ZT

The dimensionless number 'ZT' was determined by measuring several parameters affecting it as per the equation $$ZT = \frac{(S^2 * T)}{(\rho * \kappa)}$$

where, 'S' represents Seebeck coefficient, 'T' is the reference measurement temperature, 'ρ' is the electrical resistivity of the material, and 'K' is the thermal conductivity of the sample. Electrical resistivity is the reciprocal of electrical conductivity.

'κ' was calculated from the product of density, heat capacity ($C_p$) and thermal diffusivity (α) of the material.

Seebeck coefficient (S) and electrical resistivity (p) of the bulk sample were measured simultaneously as a function of temperature by ULVAC-ZEM III. Bulk Density of the sample was determined using an Archimedes method. Heat capacity was measured by 'Netzsch STA 449 C' differential scanning calorimeter. Thermal Diffusivity was measured by the Laser Flash Technique. The electrical and thermal property measurements were made in inert atmospheres or under vacuum from room temperature to 750° C.

Example 7—Preparation of Graphene

The procedure used for preparing graphene sheets is as follows: 100 mg of graphite (xGnp M-5) was firstly sonicated in 5 ml mixture of phenol and methanol (ratio: 5:1) for about 30 minutes. With addition of 10 mg hexadecyltrimethylammonium bromide (CTAB), the resultant graphite was sonicated for another 30 minutes, and was then left to soak in the mixture for 2 day. Afterwards, the resultant graphite/graphene mixture was separated by centrifugation, and was transferred into 100 ml mixture of water and methanol (ratio: 4:1), followed by stirring for 2 hours. Finally, the unwashed exfoliated graphene (EG) dispersion was stored at room temperature for further use (See Lin et al. J Phys Chem C; 2013; 117; 17237-17244).

An alternative method would be as follows: 2 ml of phenol and 4 mg of CTAB are added to 100 ml mixture of water and methanol (ratio: 4:1), followed by stirring for 0.5 hours. Afterwards, 100 mg of graphene is added in to the mixture, followed by 0.5 hour ultrasonication.

Example 8—Preparation of Graphene/STO Mixture and Composite

Preparation of 0.1 wt % graphene (EG)/strontium titanate (STO 100 nm from Aldrich) is demonstrated as an example. 10 ml of the exfoliated graphene dispersion which contains 10 mg of graphene produced as described in Example 7), was sonicated for 0.5 hour. At the same time, 10 g of STO was added into 100 ml water, followed by 0.5 hour ultrasonication. Afterwards, the graphene dispersion and the STO water dispersion were mixed together by 0.5 hour stirring and then 0.5 hour ultrasonication. The resultant mixture was left without agitation and the homogeneously mixed graphene/STO powder precipitated to the bottom of the container in 1 hour. The clear water on the top was removed. The homogeneously mixed powders left were dried at 60° C. under vacuum for 2 days. The dried powders were then milled in planetary mill at 10000 rpm for 3 hours. The resulted powders were stored in a sealed bottle for further use.

For sintering, the powders were pressed into pellets. The pellets were covered by 5% xGnp/STO mixture sintered at 1427° C., under Argon atmosphere, for 24 hours.

Example 9—Preparation of Graphene Oxide

Graphene oxide was prepared by a modified Hummers method (J. P. Rourke et al, Angew. Chem. 2011, 123, 3231-3235). Their method is as below:

Natural flake graphite (5 g) and KNO$_3$ (4.5 g) were suspended, with stirring, in concentrated sulfuric acid (169 ml).

The mixture was cooled in ice and KMnO$_4$ (22.5 g) was added over 70 mins.

The mixture was then allowed to warm to room temperature (with stirring) and then left to stir for 7 days. The mixture became thicker with time, and after about 3 days stirring became impossible.

The dark mixture was then slowly dispersed into 550 ml 5 wt % H$_2$SO$_4$ in water (approx 1 hour) and stirred for a further 3 hours.

Hydrogen peroxide (15 g, 30 vol) was added over 5 mins with considerable effervescence; the mixture turned into a yellow/gold glittery suspension and was stirred for a further 2 hours.

The mixture was then further diluted with 500 ml of 3 wt % H$_2$SO$_4$/0.5 wt % H$_2$O$_2$ and left to stir overnight.

The mixture was then centrifuged at 8,000 rpm for 20 mins, which resulted in the separation of the mixture into two roughly equal portions, together with a small quantity of very dark coloured pellet (which was discarded).

One of the portions was a clear supernatant liquid (which was decanted and discarded) the other being a thick dark yellow viscous liquid. The viscous liquid was then dispersed with vigorous shaking (5-10 mins) into a further 500 ml of 3 wt % H$_2$SO$_4$/0.5 wt % H$_2$O$_2$.

This washing procedure was repeated 12 times, during which the viscous fraction became progressively less glittery and progressively darker, such that by the 4th washing no glitter was visible.

The mixture was then washed with pure water (500 ml) and concentrated via centrifugation (discarding the colorless supernatant) until the supernatant was neutral (pH 7) (5 washing cycles). This gave a dark browny-orange viscous liquid (aGO) which can be used directly as an aqueous suspension of GO (approx concentration 3 mg ml−1) or can have the remaining water removed via high speed centrifugation (20,000 rpm, 30 mins) and vacuum drying.

Example 10—Preparation of
Graphene—Thermoelectric Oxide Composites
Using Graphene Oxide Two examples of methods to prepare graphene thermoelectric oxide composites from graphene oxide (a modified graphene) are given:—

1. Combining the thermoelectric oxide with graphite oxide (GO) and then pressing the resultant powder and sintering the pellet in an appropriate atmosphere to allow decomposition of the GO to graphene but not allowing its oxidation.

2. Combining precursors of the thermoelectric oxide with graphite oxide (GO) and then pressing the resultant powder and sintering the pellet in an appropriate atmosphere to allow decomposition of the GO to graphene but not allowing its oxidation.

Method 1

Strontium titanate (10 g) was dispersed in water (40 g) and treated ultrasonically for at least 1 hour. To this was added a previously prepared dispersion of graphene oxide (1 mg/ml). The mixture was then treated ultrasonically for at least 1 hour. The mixture was then freeze dried prior to pressing and sintering in an appropriate atmosphere.

Method 2

A strontium titanate graphene oxide composite was made by varying the method of Calderone (Chem Mater 2006 (18) 1627-1633) for production of strontium titanate.

Sodium hydroxide solution was prepared by adding 34.88 g NaOH into 1.061 of DI water, and was cooled to 0° C. in an ice bath. Strontium nitrate solution was prepared by adding 11.53 g Sr(NO$_3$)$_2$ to 28.83 g DI water. TiCl$_4$ (10.34 g) was slowly added to a stirred beaker containing ice cold water (9 g). The resulting titanium solution was slowly added into the cold stirred NaOH solution which was in an ice bath. When complete the strontium nitrate solution was added into the mixture. The cooling bath was removed and graphene oxide suspension added to give a 1% GO addition to the oxide. The mixture was then heated to 95° C. for two hours. The mixture was cooled, centrifuged and washed until supernatant has a pH of 7. The powder was then dried overnight at 85° C. before pressing and sintering.

Example 11: Composites

The following composites have been made using the above described methods:

SrTiO$_3$ (STO) with 1, and 2 wt % graphite nanoparticles (comparative example

SrTiO$_3$ with 0.05, 0.1, 0.6, 1, 2, and 5 wt % exfoliated graphene

Sr$_{0.8}$La$_{0.2/3}$Ti$_{0.8}$Nb$_{0.2}$O$_3$ (L2R) with 0.1, 0.6 and 1 wt % exfoliated graphene La$_{0.067}$Sr$_{0.9}$TiO$_3$ (LSTO) with 0.1, 0.3, 0.6 and 1 wt % exfoliated graphene (these samples were sintered at 1427° C. in an atmosphere of Ar/5% H$_2$)

These composites have been tested and compared to the parent metal oxides: SrTiO$_3$, Sr$_{0.8}$La$_{0.2/3}$Ti$_{0.8}$Nb$_{0.2}$O$_3$ and La$_{0.067}$Sr$_{0.9}$TiO$_3$. See FIGS. 1-4.

Figure 1:
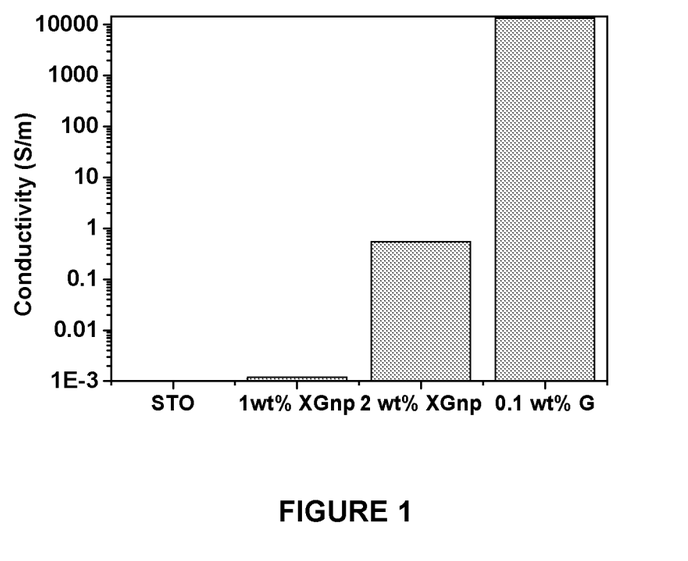
FIG. 1 shows the relative electrical conductivities of $SrTiO_3$ (STO), STO containing 1, and 2 wt % graphite nanoparticles (predominantly having 10-30 graphene layers), and STO containing 0.1 wt % exfoliated graphene (predominantly having 1-2 graphene layers). The addition of a small amount of exfoliated graphene having very few graphene layers (1-2) shows an increase in conductivity over pure strontium titanate at much lower concentrations than graphite nanoparticles, which have more layers (10-30).
Figure 2:
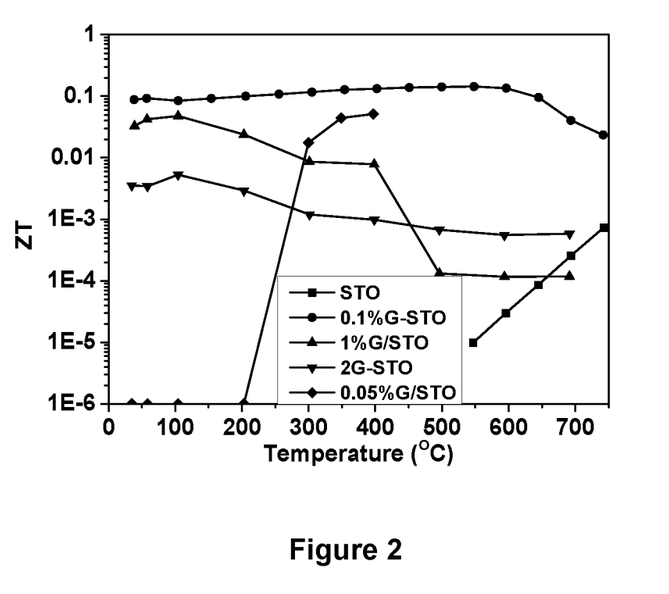
FIG. 2 shows the calculated ZT values at a range of temperatures for STO and STO containing 0.05, 0.1, 1 and 2 wt % exfoliated graphene. The addition of exfoliated graphene gives an increase in ZT in strontium titanate systems at concentrations of 0.05 to 2% graphene especially at low temperatures.
Figure 3:
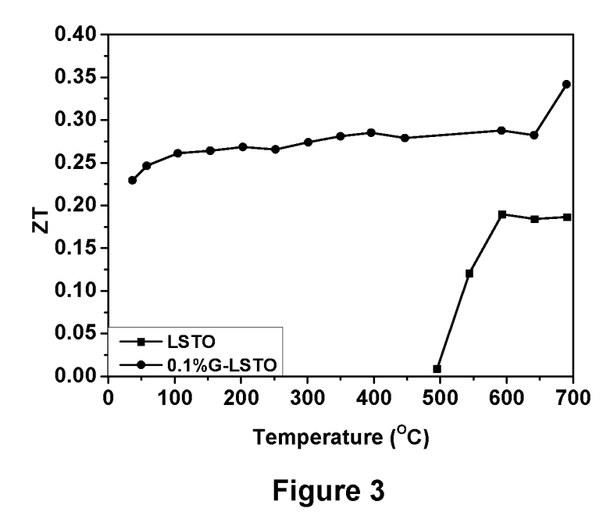
FIG. 3 shows the ZT values at a range of temperatures for $La_{0.067}Sr_{0.9}TiO_3$ (LSTO) and LSTO containing 0.1 wt % exfoliated graphene. The strontium titanate does not give a measurable ZT until temperatures over 500° C. and increases significantly with temperature. The composite materials show a more uniform value of ZT over the whole temperature range.
Figure 4:
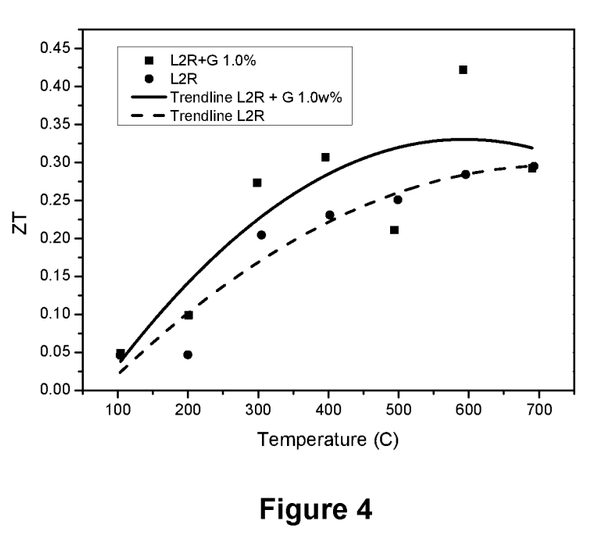
FIG. 4 shows the ZT values at a range of temperatures for $Sr_{0.8}La_{0.2/3}Ti_{0.8}Nb_{0.2}O_3$ (L2R) and L2R with 0.1, 0.6 and 1 wt % exfoliated graphene. The addition of graphene to a lanthanum niobium co-doped strontium titanate produced an increase in ZT compared to the material without graphene.

In general the composites of the invention provide higher ZT values than the metal oxides from which they are derived. At 550° C. STO with 0.1 wt % exfoliated graphene has a ZT 5 orders of magnitude higher than STO itself (FIG. 2).

LSTO with 0.1 wt % exfoliated graphene shows a ZT greater than about 0.2 (average 0.28) across the full temperature range 0-700° C. At 700° C. LSTO with 0.1 wt % exfoliated graphene shows a ZT of 0.35. At all temperatures the ZT was higher than LSTO.

In all cases, the graphene doped materials show ZTs many times higher than the parent material at low temperatures.

The invention claimed is:

1. A thermoelectric composite material comprising:
   a metal oxide material; and
   graphene or modified graphene dispersed throughout the metal oxide material; wherein the graphene or modified graphene is present at an amount less than the percolation limit and does not form a percolated network.

2. The thermoelectric composite material of claim 1, comprising pristine graphene.

3. The thermoelectric composite material of claim 1, comprising oxidized or partially oxidized graphene.

4. The thermoelectric composite material of claim 1, wherein the metal oxide material is selected from the group consisting of Ca$_3$CoO$_9$, NaxCoO$_2$, Bi$_2$Sr$_2$Co$_2$O$_x$, SrTiO$_3$, CaMnO$_3$, ZnO and a combination thereof, each of which may or may not include a dopant.

5. The thermoelectric composite material of claim 1, wherein the metal oxide material includes a dopant.

6. The thermoelectric composite material of claim 1, wherein the graphene or modified graphene is present at an amount from 0.05 to 1 wt % of the composite.

7. The thermoelectric composite material of claim 1, wherein the metal oxide material comprises a n-type thermoelectric metal oxide material.

8. The composite material of claim 1, wherein the metal oxide material comprises a p-type thermoelectric metal oxide material.

9. A thermoelectric device comprising two or more thermoelectric units;
wherein at least one thermoelectric unit is a p-type unit and at least one thermoelectric unit is a n-type unit;
wherein the thermoelectric units are in electrical contact with one another and wherein at least one thermoelectric unit comprises:
an n-type or p-type metal oxide material; and
graphene or modified graphene dispersed throughout the metal oxide material,
wherein the graphene or modified graphene is present at an amount less than the percolation limit and does not form a percolated network.

10. The device of claim 9, wherein the at least one n-type unit comprises a thermoelectric composite material comprising a metal oxide, and graphene or modified graphene dispersed throughout the metal oxide material;
wherein the metal oxide is a n-type metal oxide material.

11. The device of claim 9, wherein the at least one p-type unit comprises a thermoelectric composite material including a metal oxide, and graphene or modified graphene dispersed throughout the metal oxide material;
wherein the metal oxide is a p-type metal oxide material.

12. A method of making a thermoelectric composite material, the thermoelectric material comprising:
an n-type or p-type metal oxide material; and
graphene or modified graphene dispersed throughout the metal oxide material, wherein the graphene or modified graphene is present at an amount less than the percolation limit and does not form a percolated network;
the method comprising:
mixing the n-type or p-type metal oxide material with the graphene or modified graphene.

13. The method of claim 12, wherein the step of mixing the n-type or p-type metal oxide material with the graphene or modified graphene comprises mixing the n-type or p-type metal oxide material and the graphene or modified graphene in a slurry to form a mixture.

14. The method of claim 13, wherein the method further comprises the step of obtaining graphene by liquid phase exfoliation.

15. The method of claim 12, wherein the step of combining the n-type or p-type metal oxide material with the graphene or modified graphene comprises depositing the graphene or modified graphene onto particles of the n-type or p-type metal oxide material and milling or grinding the particles to form a mixture.

16. The method of claim 15, wherein the deposition is electrodeposition.

17. The method of claim 15, wherein the deposition is chemical vapour deposition.

18. The method of claim 13, wherein the method further comprises, after the mixing step, the step of pressing the mixture to form a pellet.

19. The method of claim 18, wherein the method further comprises, after formation of the pellet, the step of sintering the pellet.

* * * * *